(12) United States Patent
Baniecki et al.

(10) Patent No.: US 10,873,017 B2
(45) Date of Patent: Dec. 22, 2020

(54) THERMOELECTRIC GENERATOR

(71) Applicant: FUJITSU LIMITED, Kawasaki (JP)

(72) Inventors: John David Baniecki, Zama (JP); Masatoshi Ishii, Kawasaki (JP); Kazuaki Kurihara, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/538,226

(22) Filed: Aug. 12, 2019

(65) Prior Publication Data

US 2019/0363235 A1   Nov. 28, 2019

Related U.S. Application Data

(60) Division of application No. 14/878,481, filed on Oct. 8, 2015, now Pat. No. 10,424,708, and a continuation
(Continued)

(51) Int. Cl.
  *H01L 35/12* (2006.01)
  *H01L 35/32* (2006.01)
  (Continued)

(52) U.S. Cl.
  CPC .............. *H01L 35/12* (2013.01); *H01L 35/22* (2013.01); *H01L 35/26* (2013.01); *H01L 35/32* (2013.01); *H01L 35/34* (2013.01)

(58) Field of Classification Search
  CPC ......... H01L 35/12; H01L 35/22; H01L 35/26; H01L 35/32; H01L 35/34
  See application file for complete search history.

(56) References Cited

U.S. PATENT DOCUMENTS 5,793,092 A   8/1998   Habermeier et al.
7,872,253 B2  1/2011   Ohta et al.
(Continued)

FOREIGN PATENT DOCUMENTS

JP   H08-247851   9/1996
JP   11-087789    3/1999
(Continued)

OTHER PUBLICATIONS

J.M.O. Zide et al., "Demonstration of electron filtering to increase the Seebeck coefficient in In0.53Ga0.47As/In0.53Ga0.28Al0.19As superlattices", Physical Review B74, 205335 (2006) pp. 205335-1-205335-5 (5 pages).
(Continued)

*Primary Examiner* — Mayla Gonzalez Ramos
(74) *Attorney, Agent, or Firm* — Fujitsu Patent Center

(57) ABSTRACT

A thermoelectric generator includes a perovskite dielectric substrate containing Sr and Ti and having electric conductivity by being doped to n-type; an energy filter formed on a top surface of the perovskite dielectric substrate, the energy filter including a first perovskite dielectric film, which contains Sr and Ti, has electric conductivity by being doped to n-type, and has a conduction band at an energy level higher than that of the perovskite dielectric substrate; a first electrode formed in electrical contact with a bottom surface of the perovskite dielectric substrate; and a second electrode formed in electrical contact with a top surface of the energy filter. The thermoelectric generator produces a voltage between the first and second electrodes by the top surface of the energy filter being exposed to a first temperature and the bottom surface of the perovskite dielectric substrate being exposed to a second temperature.

4 Claims, 15 Drawing Sheets

Related U.S. Application Data of application No. PCT/JP2013/060986, filed on Apr. 11, 2013.

(51) Int. Cl.
*H01L 35/22* (2006.01)
*H01L 35/26* (2006.01)
*H01L 35/34* (2006.01)

(56) References Cited

U.S. PATENT DOCUMENTS

| | | | |
|---|---|---|---|
| 2004/0151463 | A1 | 8/2004 | Talin |
| 2007/0102034 | A1 | 5/2007 | Kanno et al. |
| 2008/0210285 | A1 | 9/2008 | Hosono |
| 2009/0173932 | A1* | 7/2009 | Ohta ................ G01J 5/0859 257/15 |
| 2011/0241153 | A1 | 10/2011 | McCann |
| 2011/0284049 | A1 | 11/2011 | Iwai |
| 2012/0227780 | A1* | 9/2012 | Kurihara ............. H01L 35/34 136/224 |

FOREIGN PATENT DOCUMENTS

| | | |
|---|---|---|
| JP | 2000-252529 | 9/2000 |
| JP | 2011-243824 | 12/2011 |
| JP | 2013-507002 | 2/2013 |
| WO | 2007/020775 | 2/2007 |
| WO | 2007/132782 | 11/2007 |
| WO | 2010/073391 | 7/2010 |
| WO | 2011/044115 | 4/2011 |
| WO | 2011/065185 | 6/2011 |

OTHER PUBLICATIONS

Raseong Kim et al., "Influence of dimensionality on thermoelectric device performance", Journal of Applied Physics 105, 034506 (2009), pp. 034506-1-03450-6 (6 pages).
Tyler A. Cain et al., "Seebeck coefficient of a quantum confined, high-electron—density electron gas in SrTiO3", Applied Physics Letters vol. 100, 161601 (2012), pp. 161601-1-161601-3 (3 pages), cited in ISR for PCT/JP2013/060986.
International Search Report, mailed in connection with PCT/JP2013/060986 dated Jun. 18, 2013 (2 pages).
International Search Report dated Jul. 17, 2012 issued with respect to the related International application No. PCT/JP2012/062338.
NOA—Notice of Allowance dated Oct. 21, 2015 issued with respect to the related U.S. Pat. No. 9,269,883.
USPTO, (Gonzalez) Restriction Requirement, dated Aug. 28, 2017, in U.S. Appl. No. 14/878,481 [allowed].
USPTO, (Gonzalez) Non-Final Rejection, dated Feb. 9, 2018, in U.S. Appl. No. 14/878,481 [allowed].
USPTO, (Gonzalez) Final Rejection, dated Sep. 6, 2018, in U.S. Appl. No. 14/878,481 [allowed].
USPTO, (Gonzalez) Non-Final Rejection, dated Apr. 2, 2019, in U.S. Appl. No. 14/878,481 [allowed].
USPTO, (Gonzalez) Notice of Allowance, Notice of Allowability, dated Jun. 12, 2019, in U.S. Appl. No. 14/878,481 [allowed].

* cited by examiner

CMP

US 10,873,017 B2

THERMOELECTRIC GENERATOR

CROSS-REFERENCE TO RELATED APPLICATION

This application is a divisional of application Ser. No. 14/878,481, filed Oct. 8, 2015, which is a U.S. continuation application filed under 35 USC 111(a) claiming benefit under 35 USC 120 and 365(c) of PCT Application PCT/JP2013/060986 filed on Apr. 11, 2013, the entire contents of which are incorporated herein by reference.

FIELD

The embodiments discussed herein are related to a thermoelectric generator.

BACKGROUND

Presently, in information processing apparatuses used in factories, power plants, transportation means such as vehicles, and computers, after the energy is consumed, the energy is discharged in the environment as waste heat. Thus, a thermoelectric generator capable of recovering the waste heat and converting the same into energy, is garnering attention.

A thermoelectric generator that uses Seebeck effect does not require working fluid or complex drive mechanisms as in the case of conventional thermoelectric conversion systems, and is capable of recovering waste heat from various systems and converting the same into electric power.

Particularly, strontium titanate ($SrTiO_3$) which has been conventionally investigated in relation to application to ferroelectric devices, does not contain toxic or rare materials such as tellurium or bismuth as in the case of conventional thermoelectric generators, and is thought to be a promising material for a thermoelectric generator in view of the fact that potentially it may provide a relatively large value of 30 $\mu W/cmK^2$ through 40 $\mu W/cmK^2$ for the power factor PF, which is defined as $S^2\sigma$ ($PF=S^2\sigma$). Here, S is a Seebeck coefficient and $\sigma$ is electric conductivity of the thermoelectric generator. The power factor PF may be represented also as $S^2qn\mu$ ($PF=S^2\sigma=S^2qn\mu$), wherein n is a carrier density per unit volume, q is a carrier charge, and $\mu$ is a carrier mobility. The power factor PF corresponds to the electric power that the thermoelectric generator may provide per unit temperature difference Non-patent Document 1: Zide, J. M., et al. Phys. Rev. B74, 205335 (2006) pp 205335-1-205335-5

Non-patent Document 2: Kim, R., et al., J. Appl. Phys. 105, 034506 (2009)

While the system of $SrTiO_3$ thus has the potential of providing the power factor PF of 35 $\mu W/cmK^2$ through 40 $\mu W/cmK^2$, it nevertheless has a problem, because of relatively large value of thermal conductivity $\kappa$ of 11 W/mK for the case of a bulk crystal, in that the figure of merit ZT, defined as $$ZT=PF \cdot T/\kappa \qquad (Eq\ 1)$$

tends to take a limited value. In Equation 1, T stands for the absolute temperature, PF stands for the power factor of $SrTiO_3$, and $\kappa$ stands for the thermal conductivity of $SrTiO_3$.

To obtain a large value for the figure of merit ZT in such a thermoelectric generator formed of $SrTiO_3$, it is effective to increase the value of the Seebeck coefficient S and also the electric conductivity $\sigma$ in view of the fact that the term of power factor PF is provided by Equation 2 below.

$$PF=S^2\sigma \qquad (Eq\ 2)$$

Particularly, in the case the thermoelectric generator is used at room temperature or temperatures above the room temperature, it is desirable to increase the values of the Seebeck coefficient S and the electric conductivity $\sigma$, at the operational temperature of the thermoelectric generator such as the room temperature or the temperatures above the room temperature.

SUMMARY

According to an aspect of the embodiments, a thermoelectric generator includes a perovskite dielectric substrate containing Sr and Ti and having electric conductivity by being doped to n-type; an energy filter formed on a top surface of the perovskite dielectric substrate, the energy filter at least including a first perovskite dielectric film containing Sr and Ti and having electric conductivity by being doped to n-type, the first perovskite dielectric film having a conduction band at an energy level higher than a conduction band of the perovskite dielectric substrate; a first electrode formed in electrical contact with a bottom surface of the perovskite dielectric substrate; and a second electrode formed in electrical contact with a top surface of the energy filter, wherein the perovskite dielectric substrate and the energy filter constitute a perovskite stack having a thickness that is not greater than 0.25 mm, and the thermoelectric generator produces a voltage between the first electrode and the second electrode by the top surface of the energy filter being exposed to a first temperature and the bottom surface of the perovskite dielectric substrate being exposed to a second temperature.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

First Embodiment

Figure 1:
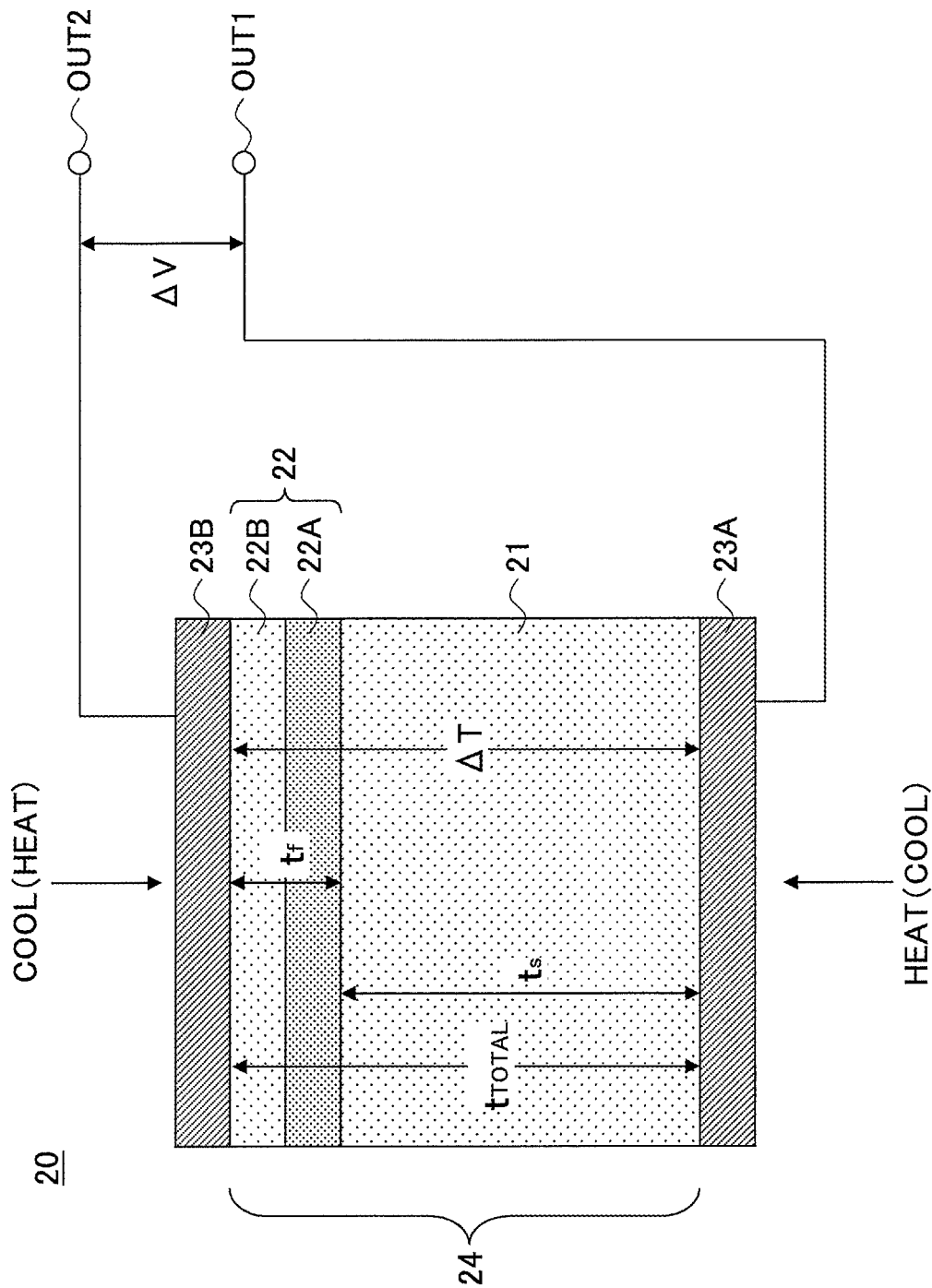
FIG. 1 is a cross-sectional diagram representing the construction of a thermoelectric generator according to a first embodiment.

FIG. 1 is a cross-sectional diagram representing the construction of a thermoelectric generator 20 according to a first embodiment.

Referring to FIG. 1, the thermoelectric generator 20 is constructed upon a single crystal substrate 21 of $SrTiO_3$ having a thickness $t_s$, wherein the $SrTiO_3$ single crystal substrate 21 and an energy filter 22 formed thereon with a thickness $t_f$ constitute together a perovskite stack 24 of a thickness $t_{TOTAL}$. Here, the perovskite stack 24 constitutes the major part of the thermoelectric generator 20 and the thickness $t_{TOTAL}$ thereof is defined as a sum of the thickness $t_s$ and the thickness $t_f$. Further, a first output electrode 23A is formed upon a bottom surface of the $SrTiO_3$ substrate 21 and a second output electrode 23B is formed on a top surface of the energy filter 22, respectively. The output electrode 23A is connected to an output terminal $OUT_1$ and the output electrode 23B is connected to an output terminal $OUT_2$.

With such a thermoelectric generator 20, there is induced a temperature difference $\Delta T$ in the perovskite stack 24 when heating or cooling is applied to the bottom surface of the $SrTiO_3$ substrate 20 via the output electrode 23A and cooling or heating is applied to the top surface of the energy filter 22 via the output electrode 23B. With this, there is obtained an output voltage given as $\Delta V=S.\Delta T$ between the output terminals $OUT_1$ and $OUT_2$ as a result of Seebeck effect. Here, S represents a Seebeck coefficient.

In the thermoelectric generator 20, the $SrTiO_3$ substrate 21 is heavily doped by La and/or Nb with a concentration of 4 atomic %, for example, and exhibits an n-type conductivity. For example, La substitutes for Sr in the A site of the perovskite structure that constitutes the $SrTiO_3$ single crystal and becomes a donor by releasing a carrier electron. Likewise, Nb substitutes for Ti in the B site of the perovskite structure and becomes a donor by releasing a carrier electron. Further, the $SrTiO_3$ substrate 21 may be doped by oxygen defects, which also acts as a donor. A bulk single crystal of $SrTiO_3$ thus doped at high density may have electric conductivity σ of 10 S/cm through 1000 S/cm at a temperature of 300 K, for example. Here, it should be noted that the doping concentration of La or Nb is not limited to 4 atomic % in the present embodiment. In the case the doping concentration of La or Nb is 4 atomic %, there appears a carrier (electron) concentration of about $6.7 \times 10^{20}$ $cm^{-3}$ in the $SrTiO_3$ bulk single crystal.

The energy filter 22, on the other hand, is constructed by stacking a first perovskite dielectric film 22A and a second perovskite dielectric film 22B formed epitaxially on the $SrTiO_3$ single crystal substrate 21, wherein both of the perovskite dielectric films 22A and 22B are doped to n-type similarly to the $SrTiO_3$ single crystal substrate 21.

In the illustrated example, the first perovskite dielectric film 22A is formed of a $Sr_xZr_{1-x}TiO_3$ film while the second perovskite dielectric film 22B is formed of a $SrTiO_3$ film of the composition identical to that of the substrate 21. Thus, there is formed a band offset of a height of $\Delta\Phi$ in a conduction band $E_c$ at the interface between the first perovskite dielectric film 22A and the second perovskite dielectric film 22B and at the interface between the first perovskite dielectric film 22A and the $SrTiO_3$ substrate 21 as represented in a band structure diagram of FIG. 2. While the illustrated example forms the energy filter 22 by a pair of perovskite dielectric films 22A and 22B, the energy filter 22 may be formed by multiple perovskite dielectric films 22A and 22B stacked alternately and repeatedly. Each of the first perovskite dielectric film 22A and the second perovskite dielectric film 22B has a film thickness of 0.5 nm through 50 nm, such as about 2.5 nm, which is sufficient for suppressing the tunneling of carriers, and the sum of the film thicknesses of these perovskite dielectric films 22A and 22B provides the film thickness $t_f$ of the energy filter 22.

Figure 2:
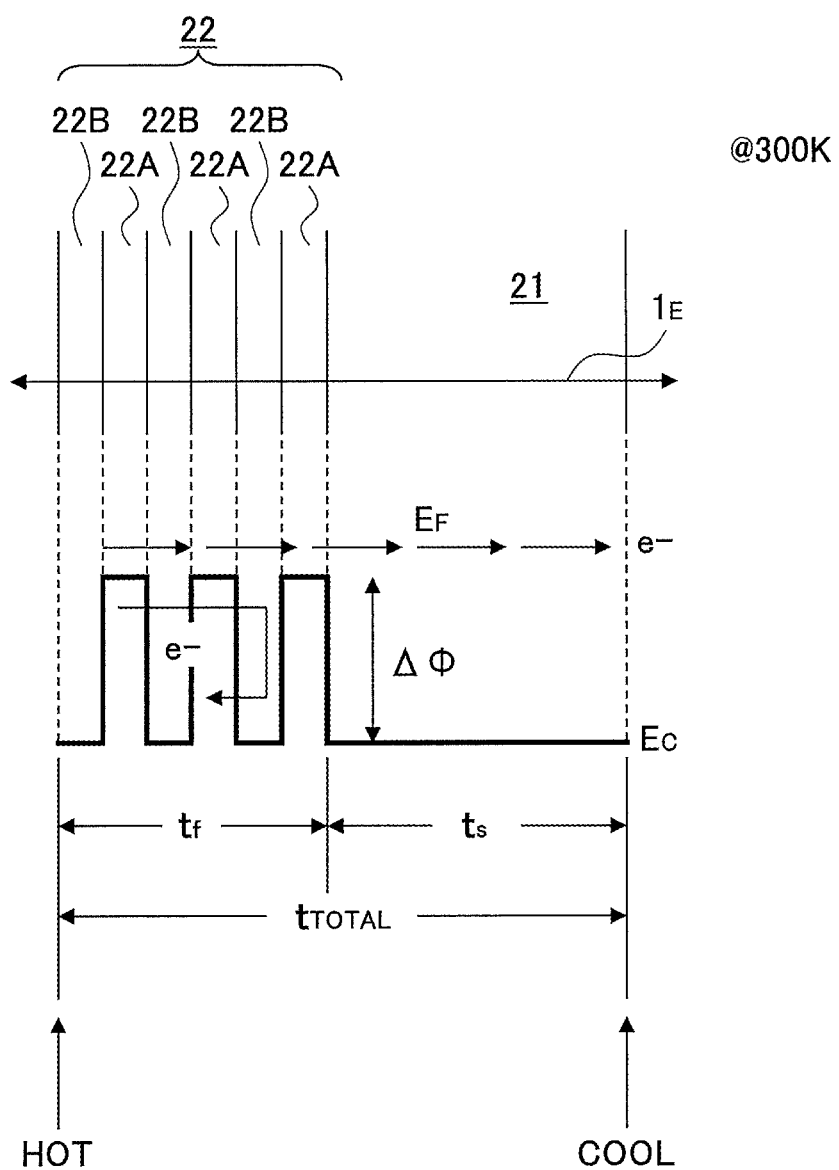
FIG. 2 is a band structure diagram representing a ballistic conduction of carriers in the thermoelectric generator of FIG. 1.

Now, consideration is made of a case in which, for example, the electrode 23B is heated and the electrode 23A is cooled, in FIG. 2. There, among the carriers (electrons) thermally excited in the perovskite dielectric film 22A or 22B, the carriers having energy equal to or larger than the foregoing band offset $\Delta\Phi$, override the potential barrier of the height $\Delta\Phi$ formed by the perovskite dielectric film 22A, and are injected into the $SrTiO_3$ substrate 21. These carriers eventually reach the electrode 23A after being transported through the $SrTiO_3$ substrate. On the other hand, carriers having energy less than the band offset $\Delta\Phi$ are blocked by the perovskite dielectric film 22 and not injected into the $SrTiO_3$ substrate 21. Therefore, these carriers are not able to reach the electrode 23A. In the band diagram of FIG. 2, the perovskite dielectric films 22A and 22B are stacked alternately and repeatedly in the energy filter 22.

FIG. 2 illustrates a length scale $l_E$ by which the carriers (electrons) may pass through the stack 24 without substantial energy loss. In the illustrated example, the length scale $l_E$ exceeds the thickness $t_{TOTAL}$ of the stack 24, and the carries may pass through the stack 24 from the bottom to the top or from the top to the bottom, without losing energy.

A Seebeck coefficient S and conductance G is generally given as follows (see Non-patent Document 2).

$$S = -\frac{k}{q} \frac{\int_{-\infty}^{-\infty} T(E)M(E)\frac{(E-E_F)}{kT}\frac{\partial f}{\partial E}dE}{\int_{-\infty}^{-\infty} T(E)M(E)\frac{\partial f}{\partial E}dE} \quad \text{(Eq 3)}$$

-continued $$G = \frac{2q^2}{h} \int_{-\infty}^{-\infty} T(E)M(E)\left(-\frac{\partial f}{\partial E}\right)dE \quad \text{(Eq 4)}$$

Here, q represents a carrier charge, T represents a temperature, $E_F$ represents a Fermi level, σ(E) represents the conductivity of carriers of energy E, T(E) represents the transmission coefficient, M(E) is the number of conducting channels, h represents a Planks constant, and f(E) represents a Fermi-Dirac distribution function at energy E. The preceding expressions are valid for both ballistic and diffusional transport. For ballistic transport T(E)=1.

Here, the electric conductivity σ is represented as (using G from Equation (4))

σ=GA/l where A is the cross sectional area of the device and l is the device length.

From Equations (3) and (4), it may be seen that a term $E-E_F$ is included in a kernel of the integral that defines the Seebeck coefficient S. Thus, when the integral of the Seebeck coefficient S of Equation (3) is taken from the bottom edge to the top edge of the conduction band $E_c$, the integral taken in the range in which the energy E is lower than the Fermi level $E_F$ cancels out a large part of the integral taken in the range in which the energy E is higher than the Fermi level $E_F$, and only a small Seebeck coefficient S is obtained in spite of the use of the $SrTiO_3$ single crystal, which is potentially capable of providing a large Seebeck coefficient S.

Contrary to the foregoing, the thermoelectric generator 20 of FIG. 1 cuts out those carriers of the $SrTiO_3$ substrate 21 having the energy E lower than the Fermi level $E_F$ by filtering by providing the energy filter 22 upon the doped conductive $SrTiO_3$ substrate 21, and is capable of realizing a large Seebeck coefficient S.

Figure 3:
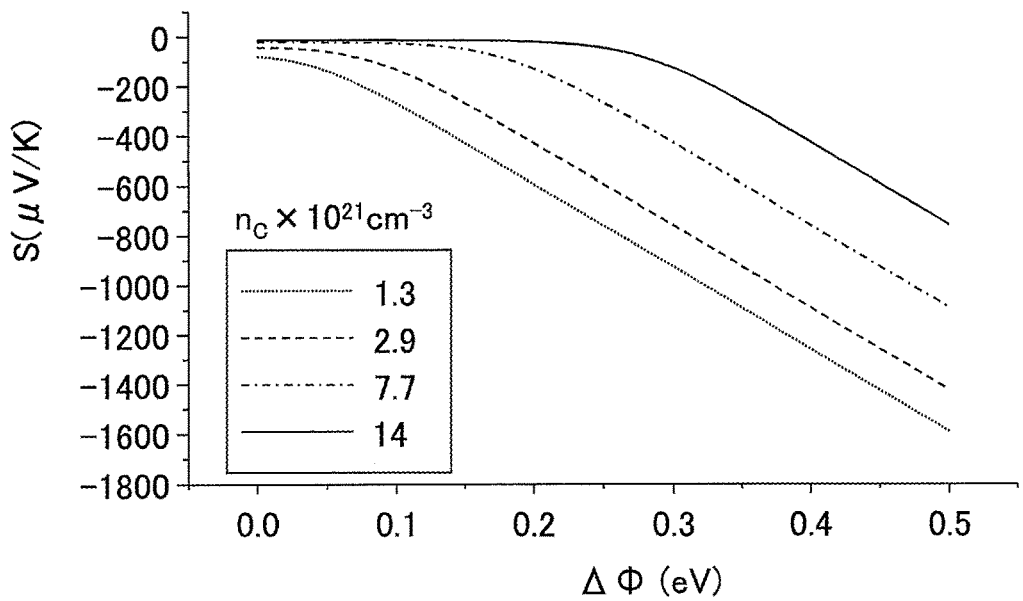
FIG. 3 is a graph representing the relationship between the band offset $\Delta\Phi$ and a Seebeck coefficient S in the thermoelectric generator of FIG. 1 with respect to various doping levels.

FIG. 3 represents some examples of obtaining a Seebeck coefficient S for the case where a band offset of 0.0 eV through 0.05 eV is formed in a dielectric film of a $SrTiO_3$ crystal doped to various doping levels.

Referring to FIG. 3, the Seebeck coefficient S is obtained for the cases in which the doping level is $1.3 \times 10^{21}$ cm$^{-3}$, $3.9 \times 10^{21}$ cm$^{-3}$, $7.7 \times 10^{21}$ cm$^{-3}$ and $14 \times 10^{21}$ cm$^{-3}$, respectively, wherein it may be seen that the Seebeck coefficient S takes almost a zero value in any doping level, as long as the band offset ΔΦ is 0 eV, and hence in the case where no energy filtering is applied. On the contrary, when the band offset ΔΦ is increased, there is a general tendency that the absolute value of the Seebeck coefficient S is increased with increase of the band offset ΔΦ.

FIG. 3 clearly demonstrates the effect of carrier filtering by the energy filter 22 upon the Seebeck coefficient S, and it may be seen that, with the thermoelectric generator 20 of FIG. 1, it is possible to increase the absolute value of the Seebeck coefficient S by the mechanism such as the one represented in FIG. 2.

Figure 4:
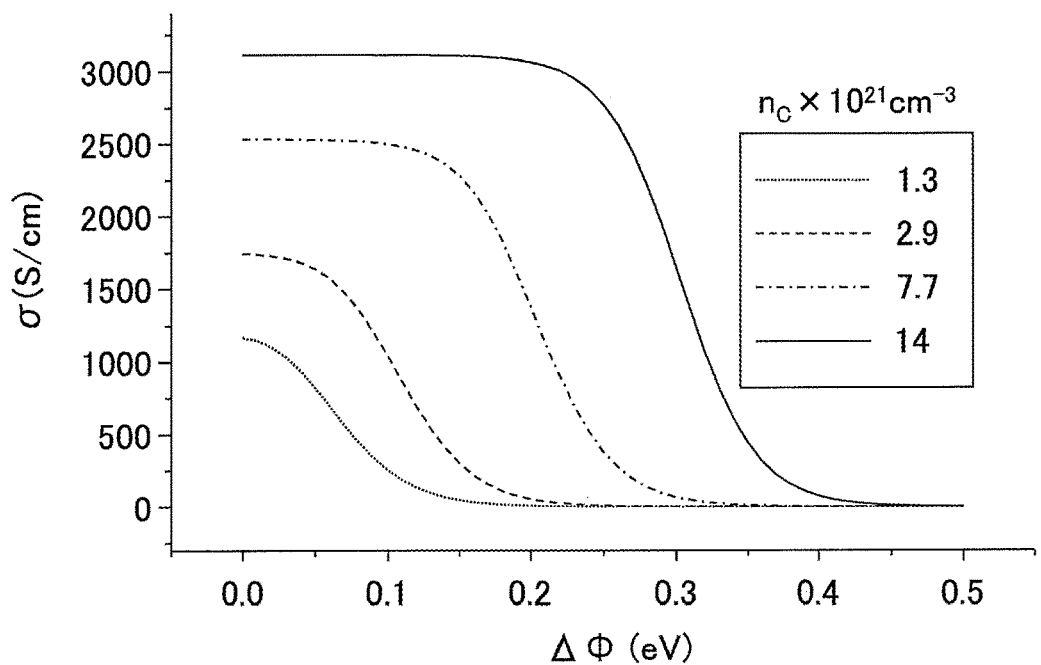
FIG. 4 is a graph representing the relationship between the band offset $\Delta\Phi$ and electric conductivity $\sigma$ in the thermoelectric generator of FIG. 1 with respect to various doping levels.

FIG. 4 is a graph representing the relationship between the electric conductivity σ and the band offset ΔΦ for the stack 24 for the case where the $SrTiO_3$ substrate 21 and a $SrTiO_3$ single crystal film constituting the energy filter 22 are doped to various doping levels in the thermoelectric generator 20 of FIG. 1.

As seen from FIG. 4, the electric conductivity σ takes a large value in any of the doping levels when the value of the band offset ΔΦ is small. This again demonstrates the effect of cutting of low energy carriers by the energy filter 22.

Figure 5:
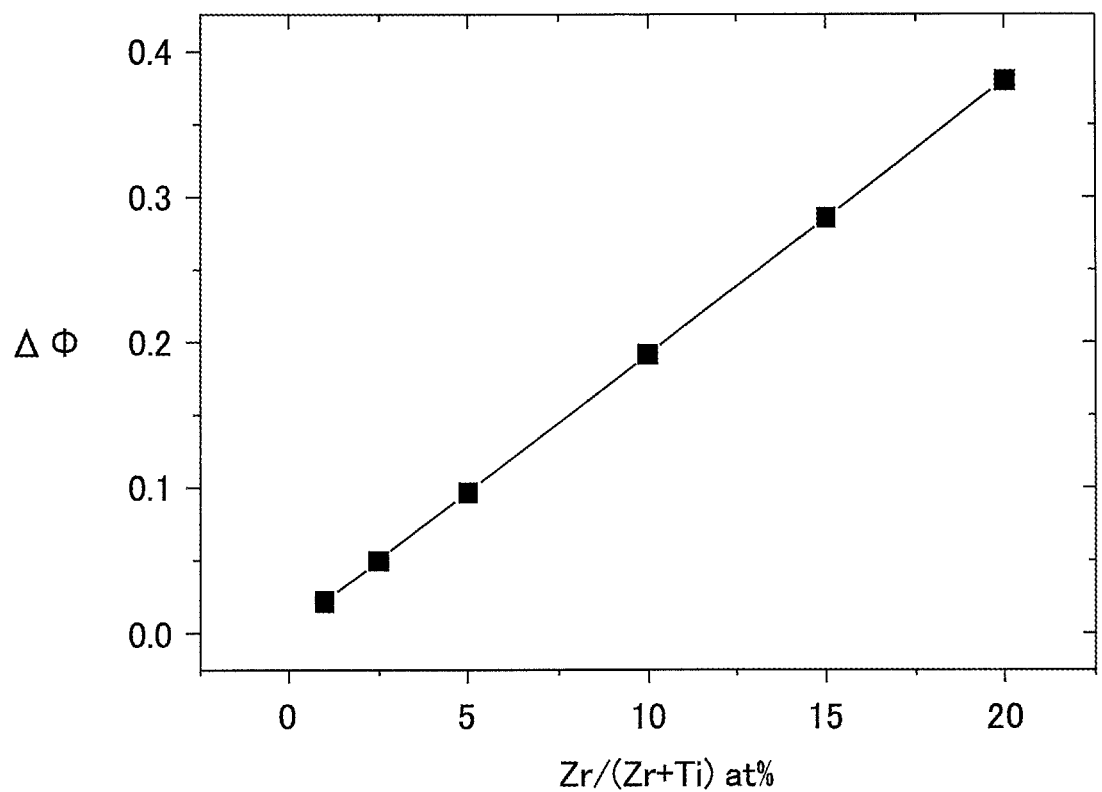
FIG. 5 is a graph representing the relationship between a Zr content in a SrZrTiO3 crystal and the band offset $\Delta\Phi$.

FIG. 5 is a graph representing the relationship between a Zr content in the first perovskite dielectric film 22A of the energy filter 22 and the band offset ΔΦ, wherein the horizontal axis represents a Zr content defined as Zr/(Zr+Ti) in terms of an atomic %. The vertical axis represents the band offset ΔΦ represented in terms of eV.

As seen in FIG. 5, the band offset ΔΦ, and hence the barrier height in the energy filter 22, may be set to a desired value by controlling the Zr content in the perovskite dielectric film 22A. For example, a band offset ΔΦ of about 0.05 eV may be attained by setting the Zr content to 2 atomic % and the Ti content to 98 atomic % in the representation of Zr/(Zr+Ti). Further, from FIG. 5, it is seen that a band offset ΔΦ of about 0.39 eV is attained by setting the Zr content to 20 atomic % and the Ti content to 80 atomic % in the representation of Zr/(Zr+Ti).

It is desirable that the perovskite dielectric films 22A and 22B of the energy filter 22 are formed to have a film thickness of 2.5 nm or more such that no carrier tunneling is caused. Further, the thickness $t_s$ of the $SrTiO_3$ substrate 21 is preferably set larger than the thickness $t_f$ of the energy filter 22 from the manufacturing viewpoint in the present embodiment as will be explained below.

In the thermoelectric generator 20 of FIG. 1, the thickness $t_s$ of the $SrTiO_3$ substrate 21 and the thickness $t_f$ of the energy filter 22 are chosen such that the thickness $t_{TOTAL}$ of the perovskite stack 24 is less than 0.1 mm, preferably 0.01 mm or less, such as 0.005 mm. By imposing such a limitation upon the thickness $t_{TOTAL}$ of the perovskite stack 24, the present embodiment reduces the energy relaxation of carriers in the perovskite stack 24 as will be explained below.

Inherently, a $SrTiO_3$ bulk single crystal exhibits a carrier (electron) mobility μ exceeding 30,000 cm$^2$/Vs at an extremely low temperature of about 4K, and thus, the use of a $SrTiO_3$ bulk single crystal for the thermoelectric generator is effective for increasing the power factor PF, which is given as PF=$S^2$σ=$S^2$qnμ (as described above). In such extremely low temperatures, the carriers (electrons) are transported in the $SrTiO_3$ bulk single crystal by ballistic conduction for a long distance without experiencing scattering by phonons and energy relaxation, and a large power factor PF and a large figure of merit ZT are attained without imposing a limitation upon the thickness $t_{TOTAL}$ of the stack 24.

Figure 6:
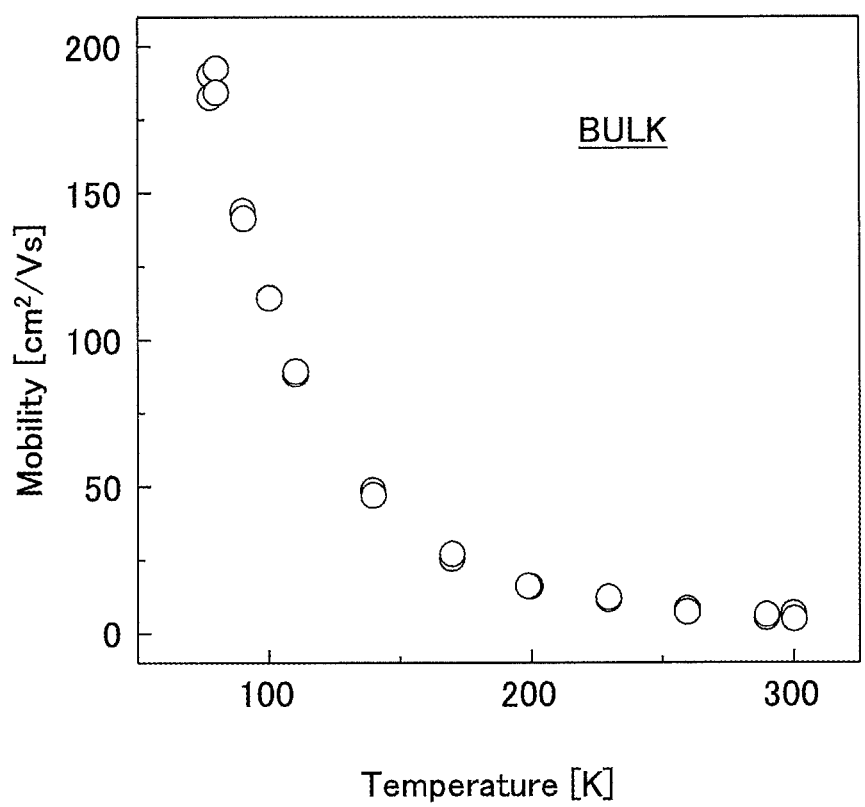
FIG. 6 is a graph representing the relationship between the temperature and the mobility of carriers in a SrTiO3 bulk single crystal.

At room temperature, such as the temperature of 300 K, for example, the carriers (electrons) experience substantial phonon scattering in the $SrTiO_3$ single crystal, and there is caused a relaxation of carrier energy as well as decrease of mean free path. As a result, the carrier (electron) mobility is decreased to about 7 cm$^2$/Vs as represented in FIG. 6. With this, there is inevitably caused a decrease of power factor PF and the figure of merit ZT. It should be noted that FIG. 6 is a graph representing the mobility of an electron in a $SrTiO_3$ bulk single crystal in the range of 50 K to 300 K.

Figure 7:
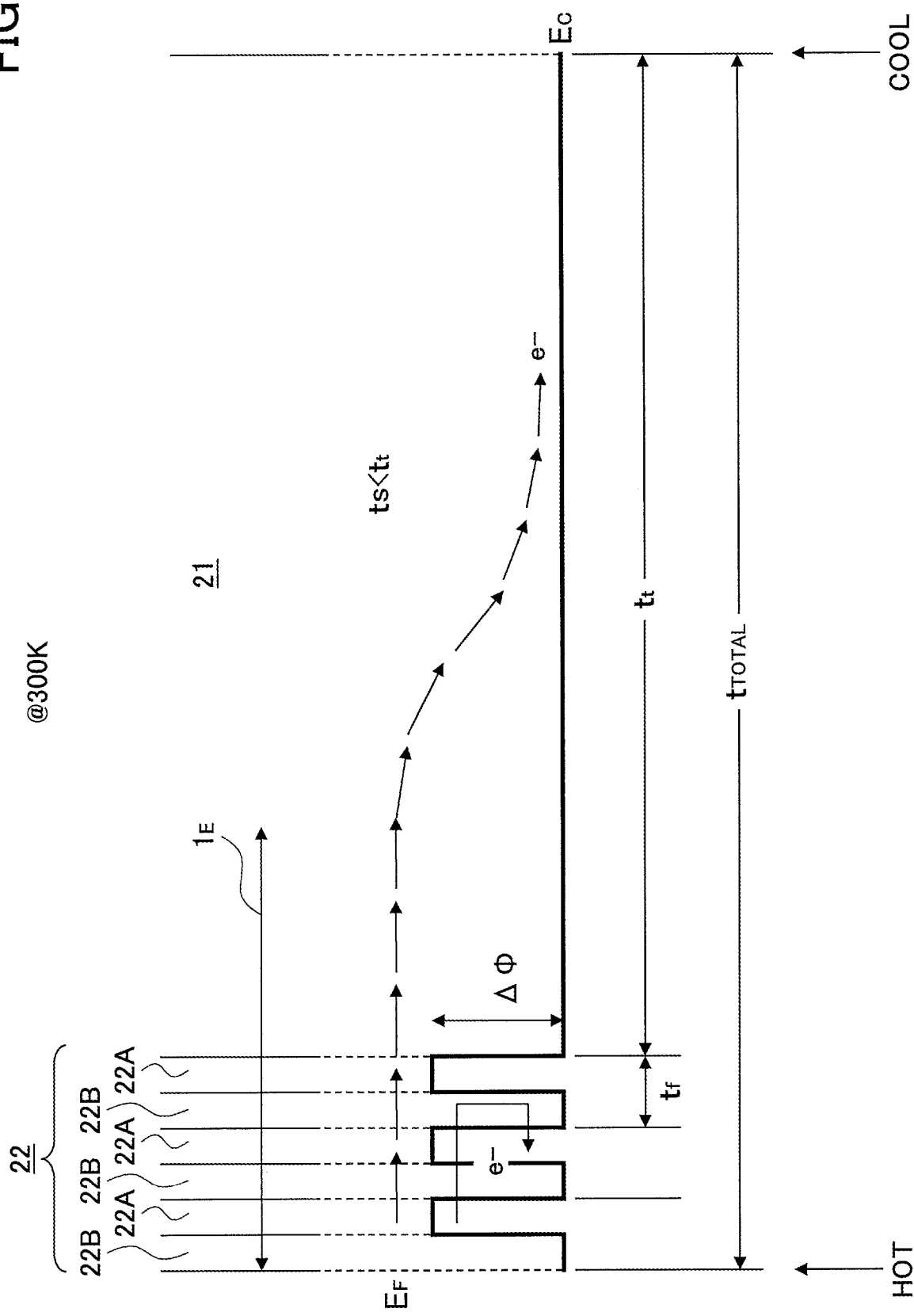
FIG. 7 is a band structure diagram representing the conduction of carriers in a thermoelectric generator according to a comparative example.

FIG. 7 is a diagram representing a band structure similar to that of FIG. 2 for a thermoelectric generator according to a comparative example.

Referring to FIG. 7, the thermoelectric generator of the comparative example has a construction similar to that of the thermoelectric generator 20 of FIG. 1 except that the thickness $t_t$ of the substrate corresponding to the $SrTiO_3$ substrate 2 of the construction of FIG. 1 is set far larger than the thickness $t_s$ of the $SrTiO_3$ substrate 21 of the thermoelectric generator 20 of FIG. 1. As a result, in the comparative example of FIG. 7, the thickness $t_{TOTAL}$ largely exceeds the length scale $l_E$ by which the carriers may pass without energy loss, and therefore the carriers (electrons) loose energy in each phonon scattering as the carriers (electrons) are transported from the side of the electrode 23A to the side of the electrode 23B.

Thus, with the thermoelectric generator according to the comparative example of FIG. 7, there is caused a decrease of power factor PF, when the thermoelectric generator is operated at room temperature, by the effect of decrease of the carrier (electron) mobility μ explained previously. Further, by the effect where, the integral of the Seebeck coefficient S of Equation (3), of the integral taken in the range in which the energy E is lower than the Fermi energy $E_F$ cancels out the integral taken in the range in which the energy E is higher than the Fermi energy $E_F$, it is not possible to obtain sufficient electric power.

Contrary to the foregoing, the thermoelectric generator 20 according to the first embodiment represented in FIG. 1 imposes a limitation upon the thickness $t_{TOTAL}$ of the perovskite stack 24 to a thickness of 0.1 mm or less, such that, in the perovskite stack 24 at room temperature such as the temperature of 300 K, the energy relaxation of carriers is reduced as they traverse the perovskite stack 24, and there is caused ballistic conduction or quasi-ballistic conduction in the carriers (electrons) with respect to the length scale so that energy is relaxed $l_E$ in the perovskite stack 24. Thus, by imposing a limitation upon the thickness $t_{TOTAL}$ of the perovskite stack 24, the effect of the energy filter 22 appears conspicuously upon the Seebeck coefficient S, and in addition to this, there appears an increase of carrier mobility μ. Thus, there is caused an increase in the electric conductivity σ and corresponding increase of the power factor PF and the figure of merit ZT.

In ballistic conduction, with respect to the length scale $l_E$ where energy is relaxed (see FIG. 2), the energy loss of a carrier (electron) traversing the perovskite stack 24 does not depend upon the thickness $t_{TOTAL}$, as the length scale $l_E$ of energy relaxation is larger than the thickness $t_{TOTAL}$ and the carriers are transported through the perovskite stack 24 without energy loss. On the other hand, quasi-ballistic conduction, with respect to the length scale $l_E$ where energy is relaxed, is an intermediate conduction state between the ballistic conduction and diffusion conduction. Thus, in quasi-ballistic conduction, the thickness $t_{TOTAL}$ of the perovskite stack 24 is larger than the length scale $l_E$, yet, the transport of the carriers (electrons) is not in accordance with the Ohm's law. Thus, the carriers loose energy at an intermediate value between the energy value of the ballistic conduction and the energy value where diffusion conduction occurs.

The distance in which conduction of carriers (electrons) without energy loss takes place in a $SrTiO_3$ single crystal is estimated to be about 0.06 mm at 10 K, 0.01 mm at 50 K, 0.006 mm at 100 K, 0.0001 mm at 200 K, and 0.0001 mm at 300 K.

Further, the distance in which quasi-ballistic conduction of carriers (electrons) takes place in a $SrTiO_3$ single crystal is estimated to be about 0.1 mm at 10 K, 0.03 mm at 50 K, 0.01 mm at 100 K, 0.001 mm at 200 K, and 0.001 mm at 300 K.

With the present embodiment, it should be noted that, as a result of imposing limitation upon the thickness $t_{TOTAL}$ of the perovskite stack 24, there is caused ballistic or quasi-ballistic conduction of carriers (electrons), with respect to the length scale $l_E$ where energy is relaxed, in the perovskite stack 24, and the effect of the energy filter 22 is maintained even when the value of the band offset ΔΦ is relatively small. Thus, with the present embodiment, it is possible to reduce band offset ΔΦ formed in the energy filter 22, and hence the height of the potential barrier formed in the energy filter 22, while such reduction of the band offset ΔΦ leads to further increase of the electric conductivity σ explained previously with reference to FIG. 4, and hence further increase of the power factor PF defined as PF=$S^2$σ and the figure of merit ZT.

In the case of the comparative example of FIG. 7, because the carriers (electrons) loose energy as a result of scattering by phonons, or the like, it is necessary to set a large value for the band offset ΔΦ in order to maintain the effect of the energy filter 22. However, such a high potential barrier formed in the energy filter 22 invites the problem of decrease of the power factor PF and the figure of merit ZT due to the decrease of the electric conductivity σ.

Thus, from the viewpoint of increasing the Seebeck coefficient S, it is preferable to reduce the thickness $t_{TOTAL}$ of the stack 24 as much as possible in the thickness range of 0.1 mm at 10 K or 0.001 mm or less at the temperature of 300 K. On the other hand, because the thermoelectric generator 20 of FIG. 1 is a device that generates electric power based upon a temperature difference ΔT, excessive decrease of the thickness $t_{TOTAL}$ may lead to a situation in which it is not possible to form sufficient temperature difference ΔT even when the perovskite stack 24 of the construction of FIG. 1 is heated via the electrode 23B and cooled via the electrode 23A or when the perovskite stack 24 is heated via the electrode 23A and cooled via the electrode 23B in view of thermal conduction occurring in the perovskite stack 24. In such a case, it is not possible to obtain sufficient electric power.

Figure 8:
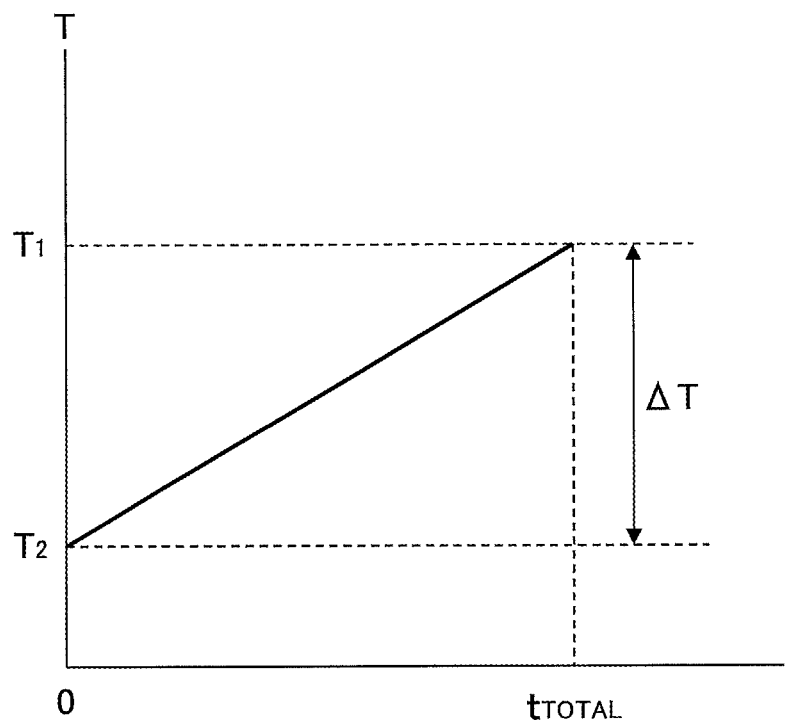
FIG. 8 is a graph representing the temperature difference formed in the thermoelectric generator of FIG. 1.

FIG. 8 is a graph schematically representing the temperature distribution profile caused in the perovskite stack 24 of the thermoelectric generator 20 by holding the top end of the perovskite stack 24 to a temperature T1 via the electrode 23B and the bottom of the perovskite stack 24 to a temperature T2 via the electrode 23A. It should be noted that the temperature distribution profile of FIG. 8 assumes one-dimensional steady-state heat conduction occurring in the perovskite stack 24 having a generally uniform thermal conductivity κ.

Referring to FIG. 8, it is seen that for equal thermal conductivity of each layer there is induced a generally linear temperature distribution provided in the perovskite stack 24 between the electrode 23A and the electrode 23B, wherein it will be noted that there is caused a problem that the temperature difference ΔT is decreased with decreasing thickness $t_{TOTAL}$ of the perovskite stack 24 because of increased heat flow caused in the perovskite stack 24 by heat conduction, particularly in the case where cooling the electrode 23B is conducted by natural cooling not using energy.

Thus, when the thermoelectric generator 20 of FIG. 1 is operated at room temperature, there would occur a decrease in the value of the Seebeck coefficient S when the thickness $t_{TOTAL}$ of the perovskite stack 24 has exceeded a predetermined upper limit value $t_{TOTAL)max}$ due to the fact that the ballistic conduction or quasi-ballistic conduction of the carriers (electrons), with respect to the length scale $l_E$ so that energy is relaxed, is lost. When this occurs, there is caused a decrease of the power factor PF and the figure of merit ZT for the thermoelectric generator 20. On the other hand, when the thickness $t_{TOTAL}$ is less than a predetermined lower limit value $(t_{TOTAL})_{min}$, a sufficient temperature difference ΔT is not formed in the perovskite stack 24 and it is not possible to obtain a sufficient voltage between the output terminals $OUT_1$ and $OUT_2$.

Figure 9:
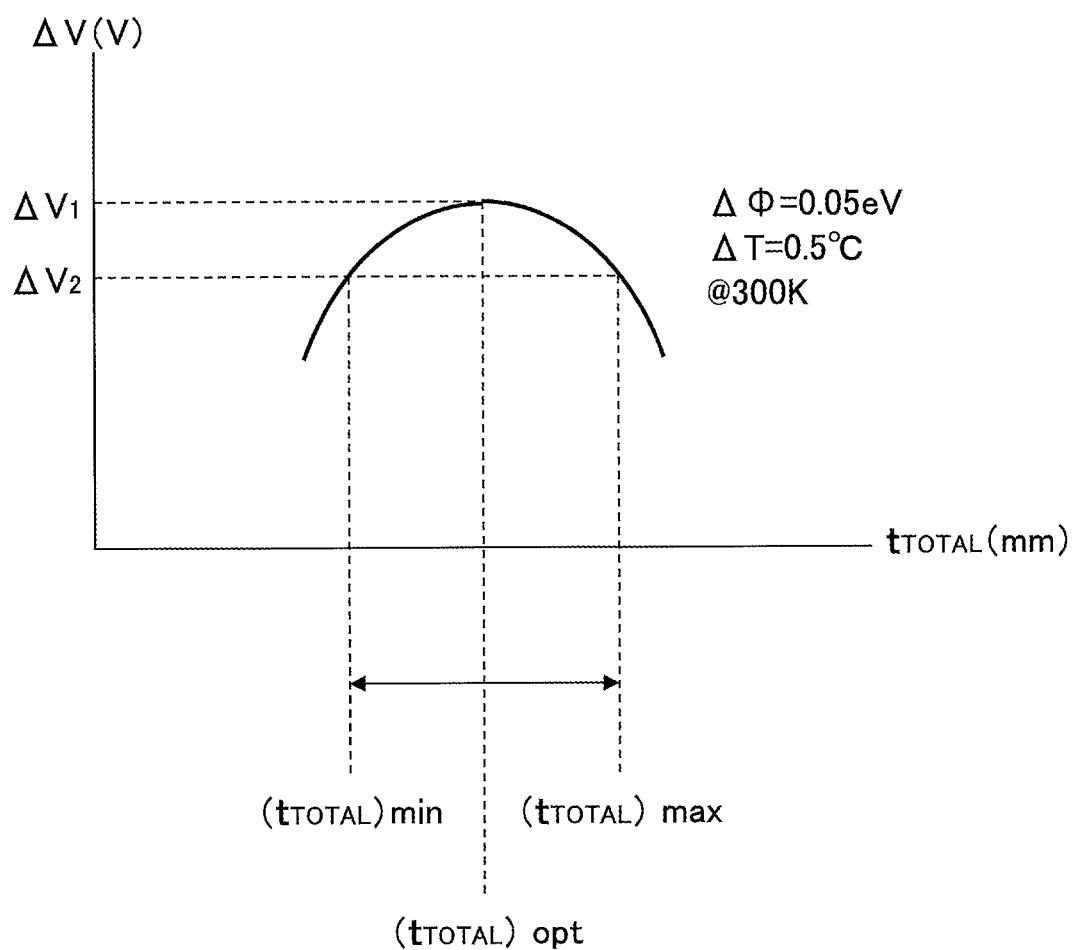
FIG. 9 is a graph for obtaining the optimum thickness of a perovskite stack in the thermoelectric generator of FIG. 1.

FIG. 9 is a graph representing the relationship between the output voltage ΔV obtained between the output terminals OUT$_1$ and OUT$_2$ and the thickness t$_{TOTAL}$ of the perovskite stack 24 for the case a temperature difference ΔT of 0.5° C. is formed in the thermoelectric generator 20 of FIG. 1, in which a band offset ΔΦ of 0.05 eV is formed in the energy filter 22, at the temperature of 300 K (operational temperature). Here, the operational temperature of "300 K" designates the temperature of the perovskite stack 24 at the side in which the heating is applied.

Referring to FIG. 9, it is seen that the output voltage ΔV takes a maximum voltage value ΔV$_1$ in the case where the thickness t$_{TOTAL}$ takes an optimum value (t$_{TOTAL}$) opt of about 0.1 mm and a voltage of about 0.25 mV is obtained. Further, from FIG. 8, it will be noted that, when the thickness t$_{TOTAL}$ has exceeded the thickness of about 0.1 mm in correspondence to the predetermined upper limit value (t$_{TOTAL}$)$_{max}$ or when the thickness t$_{TOTAL}$ has become smaller than the thickness of about 0.02 mm in correspondence to the predetermined upper limit value (t$_{TOTAL}$)$_{min}$, the output voltage ΔV becomes lower than a voltage of 0.05 mV corresponding to the desirable minimum voltage value ΔV$_2$.

Thus, with the present embodiment, high output power may be obtained in the thermoelectric generator 20 of FIG. 1 by limiting the thickness t$_{TOTAL}$ of the perovskite stack 24 between the upper limit value (t$_{TOTAL}$)$_{max}$ and the lower limit value (t$_{TOTAL}$)$_{min}$.

In the thermoelectric generator 20, in the case where the SrTiO$_3$ substrate 21 and the perovskite dielectric films 22A and 22B constituting the energy filter 22 are doped to the concentration of 4 atomic % by La or Nb in the perovskite stack 24, and a potential barrier of the height of 0.05 eV is formed in the form of the band offset ΔΦ in the energy filter 22, a power factor PF of about $100 \times 10^{-4}$ W m$^{-1}$ K$^{-2}$ and a figure of merit ZT of 0.5 are obtained. In this case, electric power of about 10 mW may be obtained at the temperature of 300 K when a temperature difference of 10° C. is formed between the electrode 23A and the electrode 23B.

As explained previously, the lower limit value (t$_{TOTAL}$)$_{min}$ is restricted also by a fabrication process, and the foregoing value of about 0.001 mm may also be imposed from the viewpoint of the fabrication process.

Next, the fabrication process of the thermoelectric generator 20 of FIG. 1 will be explained.

Figure 10:
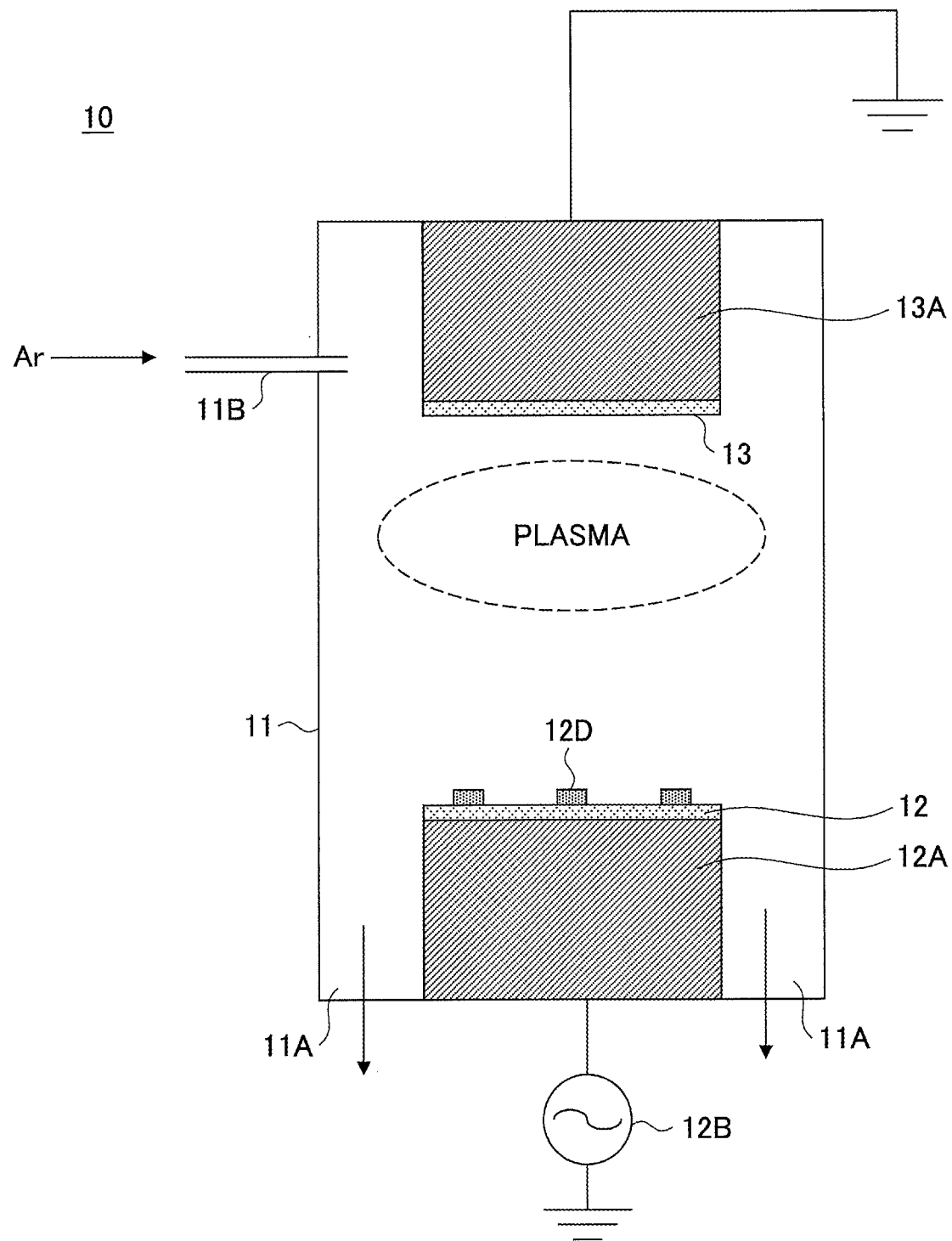
FIG. 10 is a cross-sectional diagram representing the schematic construction of a sputtering device used for fabricating the thermoelectric generator of FIG. 1.

FIG. 10 represents the structure of a sputtering device 10 used for fabricating the thermoelectric generator 20 of FIG. 1.

Referring to FIG. 10, the sputtering device 10 includes a vacuum case 11, into which sputter gas such as Ar is introduced through a sputter gas introduction port 11B, and from which the gas is discharged by high vacuum through the discharge port 11A. Below the vacuum case 11, there is provided a target holding stand 12A for holding a target 12 of the SrTiO$_3$ composition. Furthermore, above the vacuum case 11, a substrate holding stand 13A for holding a process target substrate 13 constituted by a SrTiO$_3$ single crystal doped at high density corresponding to the SrTiO$_3$ single crystal substrate 21, is provided such that the process target substrate 13 faces the target 12.

To the target holding stand 12A, a high frequency power source 12B is connected, and by applying the high frequency from the high frequency power source 12B to the target 12 via the target holding stand 12A, plasma is generated between the target 12 and the process target substrate 13 in the vacuum case 11, and as the generated plasma collides with the target 12, the components of the target are sputtered from the target 12.

Furthermore, the substrate holding stand 13A is connected to ground, and the components sputtered from the target 12 are deposited on the SrTiO$_3$ substrate 21 on the substrate holding stand 13A, and a desired perovskite dielectric film 22A or 22B is formed on the process target substrate 13. In the following description, it is assumed that the first perovskite dielectric film 22A has a composition of SrTiO$_3$, and the second perovskite dielectric film 22B has a composition of Sr(Ti,Zr)O$_3$. However, the first and second perovskite dielectric films 22A, 22B may have compositions of SrTi$_x$Zr$_y$O$_3$ and SrTi$_m$Zr$_n$O$_3$, respectively.

At this time, in the sputtering device 10 of FIG. 10, metal pieces 12D of metal elements to be doped in the strontium titanate film are provided on the target 12 by a predetermined ratio, and with this, the SrTiO$_3$ film deposited on the process target substrate 13 may be doped at a desired ratio by a desired metal element.

Figure 11:
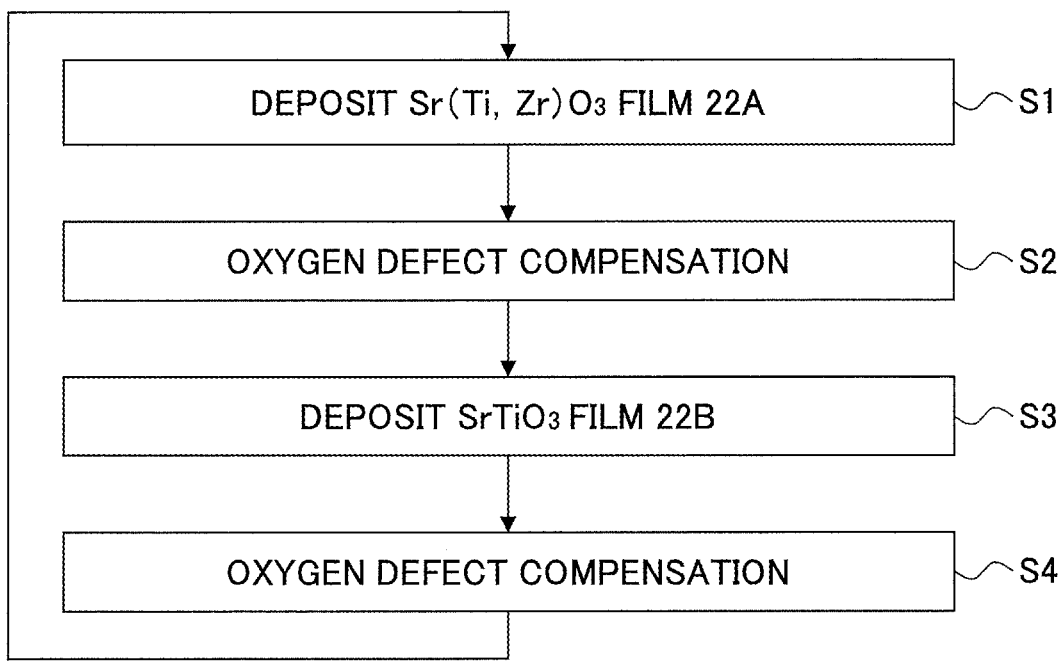
FIG. 11 is a flowchart representing the fabrication of an energy filter in the thermoelectric generator of FIG. 1.

Next, with reference to the flowchart of FIG. 11, in the present embodiment, first, in step S1, the SrTiO$_3$ substrate 21 is held on the substrate holding stand 13A as the process target substrate 13, and by using the sputtering device 10 of FIG. 10, the SrTiO$_3$ film doped at high density by La and Nb is epitaxially formed on the SrTiO$_3$ substrate 21 as the first perovskite dielectric film 22A.

Next, in step S2, the SrTiO$_3$ film 22A thus obtained is subjected to heat treatment in an oxygen environment, and the oxygen defect concentration in the SrTiO$_3$ film 22A is controlled.

Furthermore, in step S3, a SrZrO$_3$ target is further added to the target, and sputtering is performed in a similar manner to the above, such that a film having a composition of Sr(Ti,Zr)O$_3$ doped at high density by La and Nb is formed on the SrTiO$_3$ film 22A as the second perovskite dielectric film 22B.

Furthermore, in step S4, the Sr(Ti,Zr)O$_3$ film 22B thus obtained is subjected to heat treatment in an oxygen environment, and the oxygen defect concentration in the film 22B is controlled.

Figure 12:
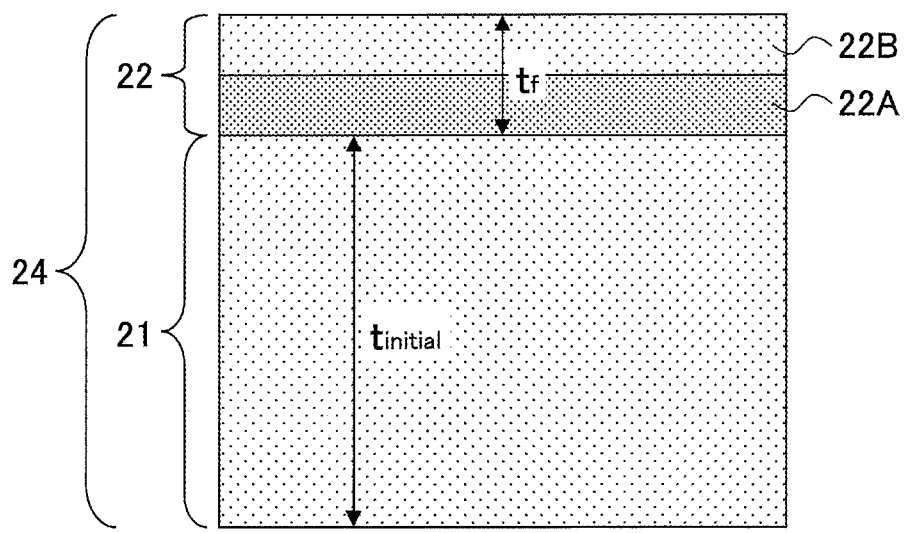
FIG. 12 is a step cross-sectional diagram describing a fabrication process of the thermoelectric generator of FIG. 1 (part 1)

Furthermore, the process returns to step S1, and steps S1 through S4 are repeated for a number of times according to need, and as illustrated in FIG. 12, the perovskite stack 24 of the thermoelectric generator 20 of FIG. 1 is obtained.

Note that the changing of the target in step S3 may be performed by using a target switching mechanism installed in the sputtering device as a standard.

Figure 13:
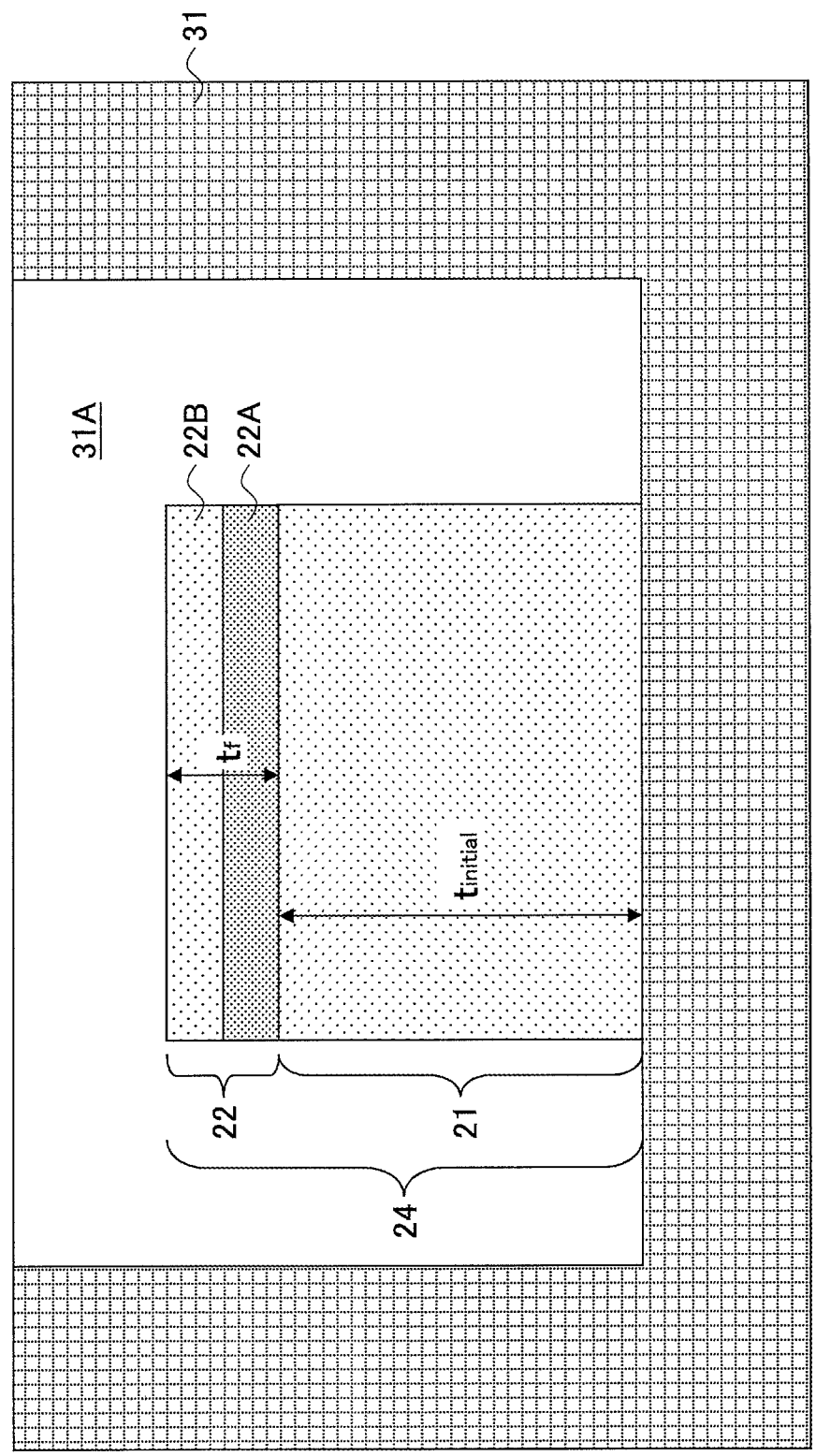
FIG. 13 is a step cross-sectional diagram describing a fabrication process of the thermoelectric generator of FIG. 1 (part 2)
Figure 14:
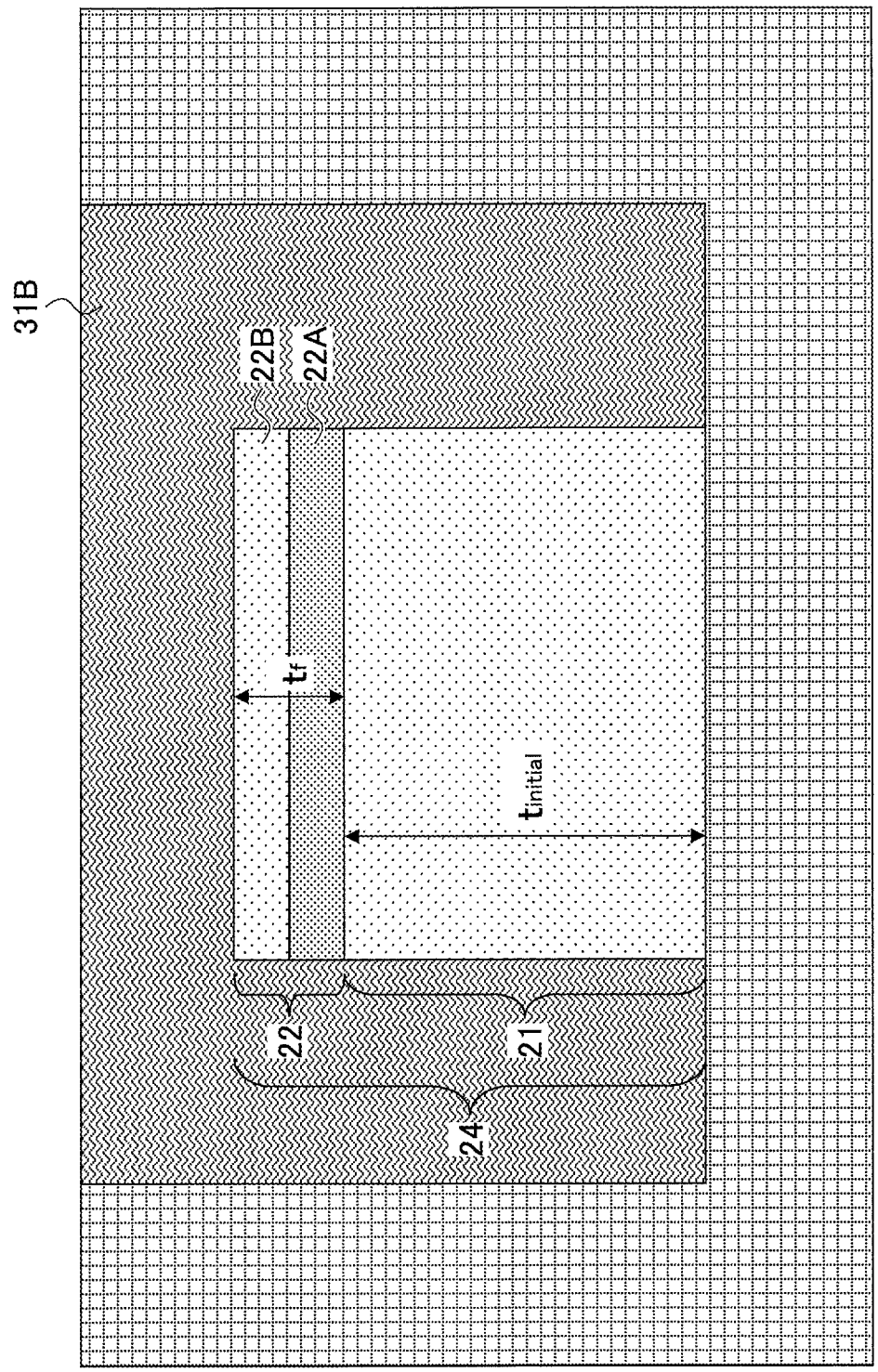
FIG. 14 is a step cross-sectional diagram describing a fabrication process of the thermoelectric generator of FIG. 1 (part 3)

Next, in the present embodiment, the perovskite stack 24 thus obtained is disposed in a depression 31A formed in the mold 31 as illustrated in FIG. 13, such that the bottom surface of the SrTiO$_3$ substrate 21 contacts the bottom surface of the depression 31A, and resin 31B is supplied to fill the depression 31A as illustrated in FIG. 14, and the resin 31B is cured. As the resin 31B, a heat-resistant resin such as polyimide and epoxy resin is preferably used. As a result of the step of FIG. 14, the perovskite stack 24 is sealed in the resin 31B.

Figure 15:
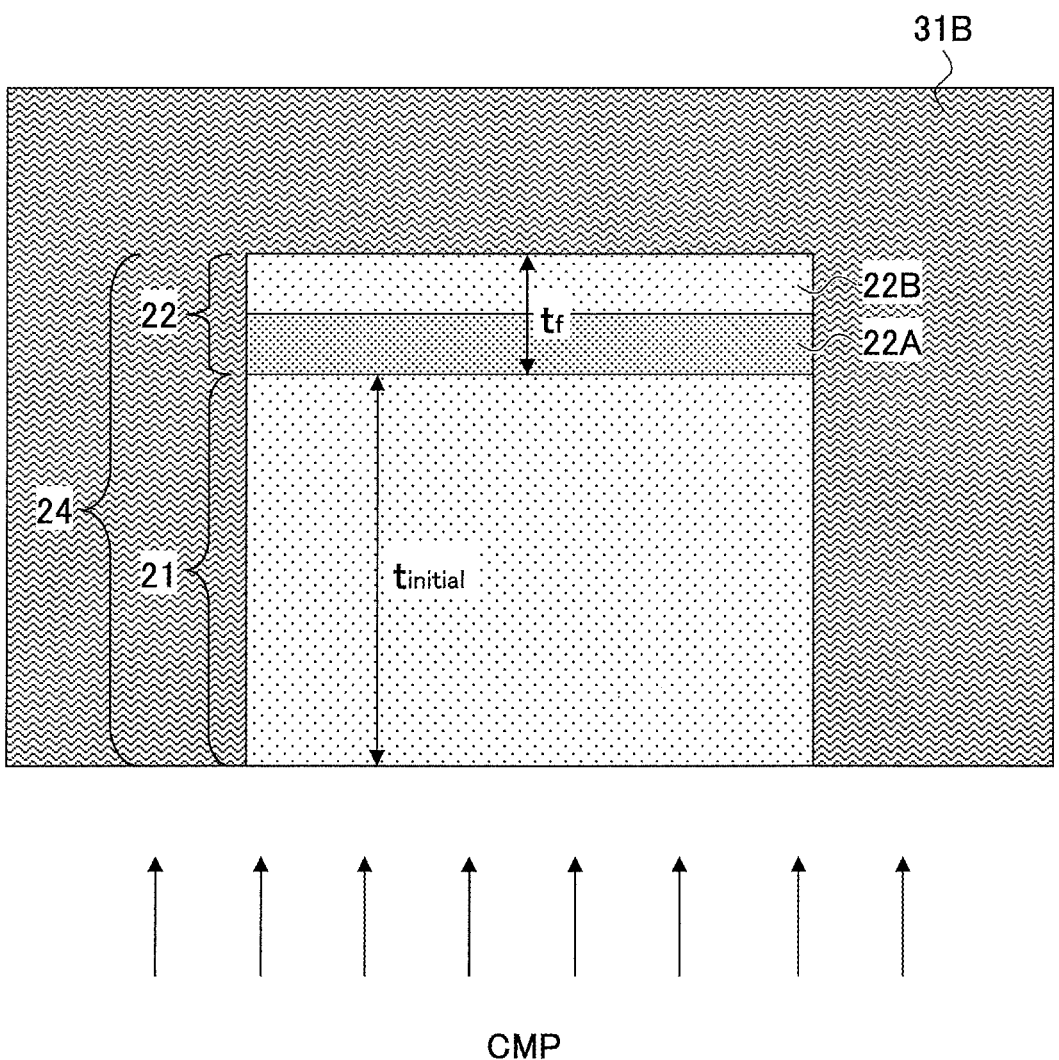
FIG. 15 is a step cross-sectional diagram describing a fabrication process of the thermoelectric generator of FIG. 1 (part 4)
Figure 16:
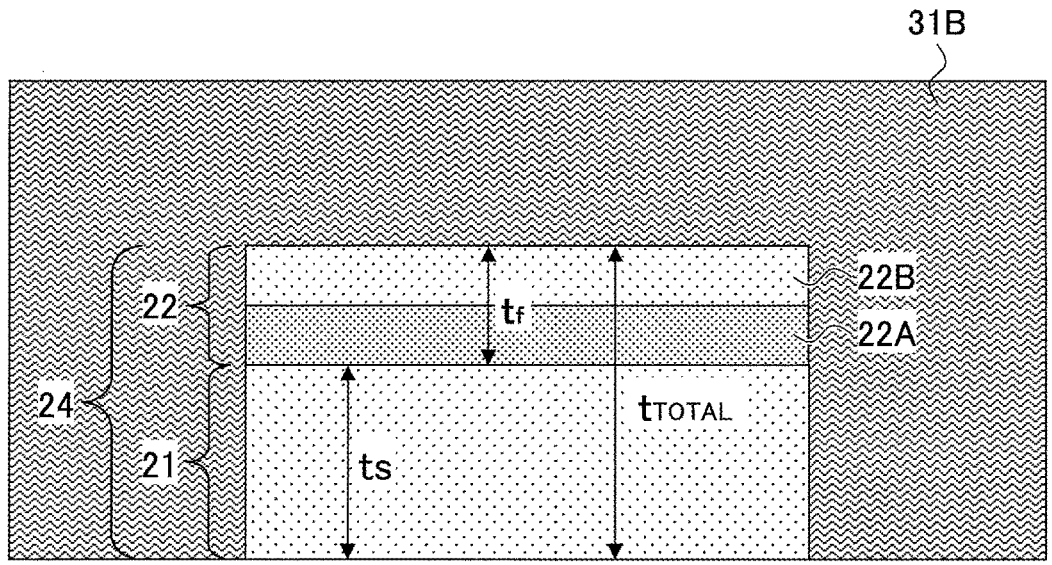
FIG. 16 is a step cross-sectional diagram describing a fabrication process of the thermoelectric generator of FIG. 1 (part 5)

Next, as represented in FIG. 15, the perovskite stack 24 is taken out from the mold 31 together with the sealing resin 31B and the thickness t$_{TOTAL}$ of the perovskite stack 24 is reduced to a thickness of 0.1 mm or less, preferably to a thickness of 0.01 mm or less, by polishing the bottom surface, that is, the bottom surface of the SrTiO$_3$ substrate 21 by a chemical mechanical polishing (CMP) process as represented in FIG. 16, such that there occurs ballistic conduction or quasi-ballistic conduction of the carriers (electrons) with respect to the length scale l$_E$ so that energy is relaxed in the perovskite stack 24 at room temperature. Thereby, when the thickness t$_{TOTAL}$ has become less than 0.001 mm, the chemical mechanical polishing process tends to become difficult even when the perovskite stack 24 is supported by the sealing resin 31B. Further, in view of growing difficulty of forming sufficient temperature difference between the top and bottom of the perovskite stack 24, the chemical mechanical polishing process preferably is discontinued when the thickness has reached 0.005 mm, or before reaching the thickness of 0.005 mm. In this state, most of the perovskite stack 24 is formed of the $SrTiO_3$ substrate 21, and thus, the thickness $t_s$ of the $SrTiO_3$ substrate 21 is generally much larger than the thickness $t_f$ of the energy filter 22. The chemical mechanical polishing of FIG. 15 may be conducted such that the polishing proceeds generally at the same rate in the perovskite stack 24 and in the resin 31B. Further, it is preferable to apply a mold lubricant (not illustrated) on the depression 31A of the mold 31 in the step of FIG. 13 such that the perovskite stack 24 is taken out easily from the mold 31 together with the sealing resin 31B in the step of FIG. 15.

Figure 17:
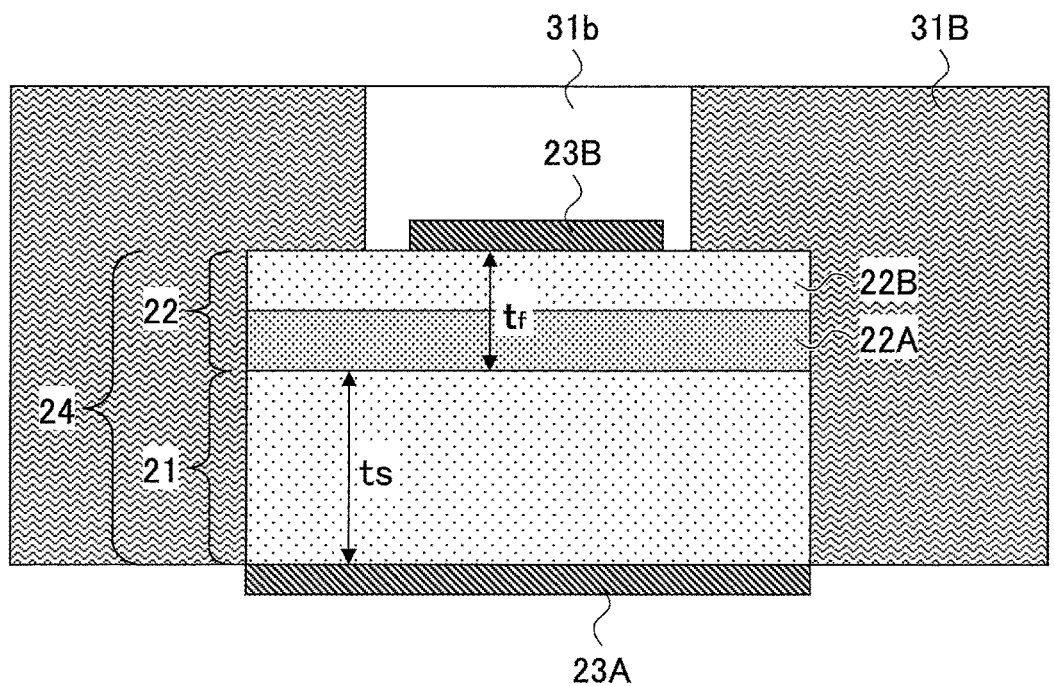
FIG. 17 is a step cross-sectional diagram describing a fabrication process of the thermoelectric generator of FIG. 1 (part 6)

Next, as illustrated in FIG. 17, an opening part 31b is formed in the sealing resin 31B for exposing the top surface of the perovskite stack 24, and by forming the output electrode 23B in the opening part, and by forming the output electrode 23A on the bottom surface of the exposed perovskite stack 24, that is, the bottom surface of the $SrTiO_3$ substrate 21, a desired thermoelectric generator 20 is obtained in a state sealed by the sealing resin 31B.

In the structure of FIG. 17, the sealing resin 31B may be removed in order to facilitate the contact of the electrode 23A and the electrode 23B to the cold source and the heat source, respectively, or the contact to the heat source and the cold source, respectively.

EXAMPLE 1

The thermoelectric generator 20 of FIG. 1 is fabricated by using a $SrTiO_3$ single crystal slab of an initial thickness $t_{initial}$ of 0.5 mm as the $SrTiO_3$ substrate 21. The $SrTiO_3$ single crystal slab has a (001) surface orientation and is doped with La in the A site with a concentration of 4 atomic %. Further, a $SrZrTiO_3$ film of the composition of $SrZr_{0.02}Ti_{0.98}O_3$ is grown on the $SrTiO_3$ substrate 21 epitaxially by a sputtering process or PLD (pulsed laser deposition) process for the energy filter 22 with a thickness of 10 nm, for example. The $SrZr_{0.02}Ti_{0.98}O_3$ film thus formed forms a potential barrier of 0.05 eV with regard to the $SrTiO_3$ substrate 21.

Figure 18:
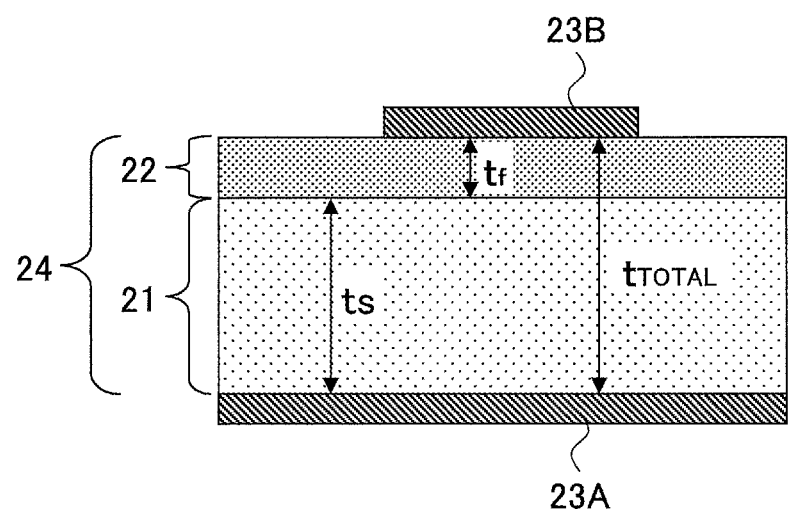
FIG. 18 is a cross-sectional diagram representing a thermoelectric generator according to a modified example.

The perovskite stack 24 thus obtained is molded with the sealing resin 31B of polyimide in the mold 31 as explained with reference to FIG. 14, and the bottom surface of the $SrTiO_3$ substrate 21 is polished by the chemical mechanical polishing process such that the thickness $t_s$ of the $SrTiO_3$ substrate 21 is reduced to 0.005 mm as explained with reference to FIGS. 15, 16. With this, the thickness of the thickness $t_{TOTAL}$ of the perovskite stack 24 is reduced also to about 0.005 mm and the structure represented in FIG. 18 is obtained.

After the output electrodes 23A and 23B are formed upon the perovskite stack 24 thus obtained, the temperature of the output electrode 23A is maintained at 300 K and the temperature of the output electrode 23B is maintained at 310 K. In this case, an output power of 1 mW was obtained between the output terminals $OUT_1$ and $OUT_2$.

In this case, a value of $95 \cdot 10^{-4}$ W m$^{-1}$ K$^{-2}$ is realized for the power factor PF and a value of 0.45 is realized for the figure of merit ZT.

EXAMPLE 2

The growth of the $SrZrTiO_3$ film 22A of the composition of $SrZr_{0.02}Ti_{0.98}O_3$ and the $SrTiO_3$ film 22B, each having a film thickness of 10 nm, is repeated twice on the $SrTiO_3$ substrate 21 epitaxially by conducting a sputtering process or PLD (pulse laser deposition) process similarly to the case of Example 1. In this case also, the $SrZr_{0.02}Ti_{0.98}O_3$ film 22A forms the potential barrier of 0.05 eV with regard to the $SrTiO_3$ substrate 21 and the $SrTiO_3$ film 22B.

Figure 19:
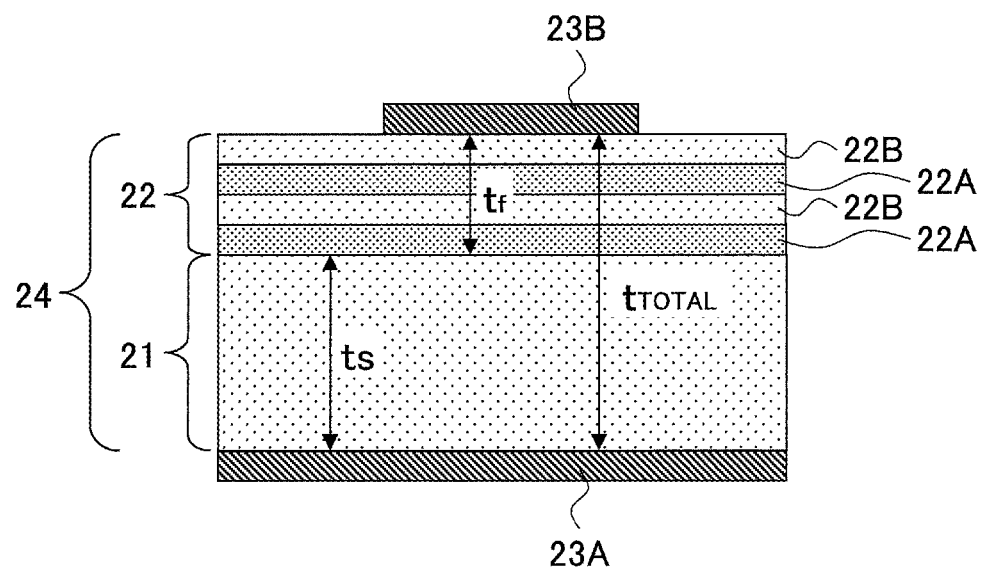
FIG. 19 is a cross-sectional diagram representing a thermoelectric generator according to another modified example.

The perovskite stack 24 thus obtained is molded with the sealing resin 31B of polyimide in the mold 31 as explained with reference to FIG. 14, and the bottom surface of the $SrTiO_3$ substrate 21 is polished by the chemical mechanical polishing process as explained with reference to FIGS. 15, 16, such that the thickness $t_s$ of the $SrTiO_3$ substrate 21 is reduced to 0.005 mm. With this, the thickness $t_{TOTAL}$ of the perovskite stack 24 is reduced also to about 0.005 mm and the structure represented in FIG. 19 is obtained.

After the output electrodes 23A and 23B are formed upon the perovskite stack 24 thus obtained, the temperature of the output electrode 23A is maintained at 300 K and the temperature of the output electrode 23B is maintained at 320 K. In this case, an output power of 3 mW was obtained between the output terminals $OUT_1$ and $OUT_2$.

In this case, a value of $105 \cdot 10^{-4}$ W m$^{-1}$ K$^{-2}$ is realized for the power factor PF and a value of 0.56 is realized for the figure of merit ZT.

In the present embodiment, it should be noted that the substrate 21 and the perovskite film 22B should not be limited to a perovskite bulk single crystal or single crystal film of the $SrTiO_3$ family but other perovskite bulk single crystals or single crystal films such as ZnO, $LaCaMnO_3$, etc., may be used. In this case, a perovskite single crystal film such as $LaCaO_3$, $LaNiO_3$, etc., may be used for the perovskite film 22A of the energy filter 22.

In the above, a description is mainly given of operations of the thermoelectric generator at room temperature; however, the energy conversion efficiency of the thermoelectric generator according to the present embodiment is increased at low temperature, and therefore the thermoelectric generator is also appropriate for usage in a low temperature environment. For example, by operating the thermoelectric generator in an environment of about 100 K or a lower temperature, an even higher energy conversion efficiency may be attained.

The present invention is not limited to the specific embodiments described herein, and variations and modifications may be made without departing from the spirit and scope of the present invention.

According to the thermoelectric generator of the present embodiment, ballistic conduction or quasi-ballistic conduction with respect to the length scale where energy is relaxed is promoted for the carriers that have experienced energy filtering by imposing a limit upon the thickness of the perovskite stack, and it becomes possible to increase the Seebeck coefficient S and the carrier mobility µ also at room temperature. As a result, it becomes possible to realize a large power factor PF and figure of merit ZT.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of fabricating a thermoelectric generator, the method comprising:
 embedding a structure in a supporting base body, the structure being constituted by a perovskite dielectric substrate containing Sr and Ti and having electric conductivity by being doped to n-type and an energy filter formed on a top surface of the perovskite dielectric substrate, the energy filter at least including a first perovskite dielectric film containing Sr and Ti and having electric conductivity by being doped to n-type, the first perovskite dielectric film having a conduction band at an energy level higher than a conduction band of the perovskite dielectric substrate, the structure being embedded in the supporting base body in a direction such that a bottom surface of the perovskite dielectric substrate in the structure faces a bottom surface of the supporting base body; and
 performing chemical mechanical polishing on the bottom surface of the perovskite dielectric substrate by polishing the bottom surface of the supporting base body together with the structure, to decrease a thickness of a perovskite stack constituted by the perovskite dielectric substrate and the energy filter to a thickness that is not greater than 0.25 mm.

2. The method according to claim 1, further comprising:
 forming an opening part on a top surface of the supporting base body, the opening part being formed to expose a top surface of the energy filter in the structure; and
 forming a first electrode and a second electrode on the bottom surface of the perovskite dielectric substrate and the top surface of the energy filter, respectively.

3. The method according to claim 1, wherein
 the supporting base body is a heat-resistant resin, and
 the embedding of the structure in the supporting base body includes
  disposing the structure in a mold such that the bottom surface of the perovskite dielectric substrate contacts a bottom surface of the mold, and
  injecting the heat-resistant resin in the mold in a state where the heat-resistant resin is fused.

4. The method according to claim 1, wherein
 the performing of the chemical mechanical polishing on the bottom surface of the perovskite dielectric substrate is executed such that a thickness of the perovskite dielectric substrate does not become less than 0.05 mm.

* * * * *